(12) United States Patent
Peng

(10) Patent No.: US 11,957,007 B2
(45) Date of Patent: Apr. 9, 2024

(54) OLED DISPLAY PANEL AND OLED DISPLAY DEVICE

(71) Applicant: Wuhan China Star Optoelectronics Semiconductor Display Technology Co., Ltd., Hubei (CN)

(72) Inventor: Ningkun Peng, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 901 days.

(21) Appl. No.: 16/970,960

(22) PCT Filed: Jun. 19, 2020

(86) PCT No.: PCT/CN2020/097107
§ 371 (c)(1),
(2) Date: Aug. 19, 2020

(87) PCT Pub. No.: WO2021/248547
PCT Pub. Date: Dec. 16, 2021

(65) Prior Publication Data
US 2023/0117698 A1    Apr. 20, 2023

(30) Foreign Application Priority Data
Jun. 11, 2020  (CN) .......................... 202010528735.7

(51) Int. Cl.
*H10K 59/131* (2023.01)
*H10K 59/80* (2023.01)
*H10K 102/00* (2023.01)

(52) U.S. Cl.
CPC ....... *H10K 59/131* (2023.02); *H10K 59/8051* (2023.02); *H10K 59/8052* (2023.02); *H10K 2102/302* (2023.02)

(58) Field of Classification Search
CPC ....... H10K 50/00–88; H10K 59/00–95; H10K 65/00; H10K 71/00–861; H10K 85/00–791; H10K 2101/00–90; H10K 2102/00–361; H10K 59/10; H10K 59/124; H10K 59/179; H10K 59/80; H10K 59/8056; H10K 59/8052; H10K 59/80522; H10K 59/82; B32B 2457/206
See application file for complete search history.

(56) References Cited

U.S. PATENT DOCUMENTS

| | | | |
|---|---|---|---|
| 2018/0197932 A1 | 7/2018 | Ho | |
| 2019/0326376 A1* | 10/2019 | Huo | ........... H10K 59/1201 |
| 2020/0051500 A1 | 2/2020 | Lin et al. | |

FOREIGN PATENT DOCUMENTS

| | | |
|---|---|---|
| CN | 108877645 | 11/2018 |
| CN | 109713162 | 5/2019 |

(Continued)

*Primary Examiner* — Julio J Maldonado
*Assistant Examiner* — Stanetta D Isaac

(57) ABSTRACT

An OLED display panel and an OLED display device are provided. The OLED display panel comprises: a substrate comprising a display area and a non-display area; a pixel driving circuit disposed on the display area, wherein the pixel driving circuit comprises a reset signal input end and a cathode signal input end; and a cathode signal trace arranged on the non-display area, wherein the cathode signal trace is electrically connected to both the reset signal input end and the cathode signal input end.

16 Claims, 6 Drawing Sheets

(56) References Cited

FOREIGN PATENT DOCUMENTS

| | | |
|---|---|---|
| CN | 110164380 | 8/2019 |
| CN | 110189702 | 8/2019 |
| CN | 110570819 | 12/2019 |
| CN | 110599955 | 12/2019 |
| JP | 2017-120375 | 7/2017 |

\* cited by examiner

OLED DISPLAY PANEL AND OLED DISPLAY DEVICE

RELATED APPLICATIONS

This application is a National Phase of PCT Patent Application No. PCT/CN2020/097107 having International filing date of Jun. 19, 2020, which claims the benefit of priority of Chinese Patent Application No. 202010528735.7 filed on Jun. 11, 2020. The contents of the above applications are all incorporated by reference as if fully set forth herein in their entirety.

FIELD AND BACKGROUND OF THE INVENTION

The present application relates to the field of display technology, in particular to an OLED display panel and an OLED display device.

Organic light-emitting diodes (OLEDs), as a new generation of display technology, has higher contrast, faster response times, and wider viewing angles, and have been widely used in the field of high-performance displays. An existing OLED display panel needs to occupy a certain space due to a cathode signal trace and a reset signal trace, making it difficult to achieve narrow bezels.

SUMMARY OF THE INVENTION

An embodiment of the present application provides an OLED display panel and an OLED display device, to solve the technical problem that it is difficult for an OLED display panel to achieve narrow bezels in the prior art.

In a first aspect, the embodiment of the present application provides an organic light emitting diode (OLED) display panel, comprising:
  a substrate comprising a display area and a non-display area disposed outside the display area;
  a pixel driving circuit disposed on the display area, the pixel driving circuit comprising a reset signal input end and a cathode signal input end; and
  a cathode signal trace disposed on the non-display area, and the cathode signal trace is electrically connected to both the reset signal input end and the cathode signal input end.

In the OLED display panel described in the embodiment of the present application, the OLED display panel comprises a wire-bypass layer, a source-drain metal layer, and a cathode layer disposed on the substrate, wherein the wire-bypass layer, the source-drain metal layer, and the cathode layer are located in different layers;
  the wire-bypass layer comprises a first connection electrode, and the first connection electrode is disposed on the display area and extends to the non-display area;
  the source-drain metal layer comprises the reset signal input end, a second connection electrode, and a cathode signal access electrode, the reset signal input end is disposed on the display area, the second connection electrode and the cathode signal access electrode are all disposed on the non-display area, and the reset signal input end is electrically connected to the cathode signal trace through the first connection electrode, the second connection electrode, and the cathode signal access electrode; and
  the cathode layer comprises the cathode signal input end, the cathode signal input end is disposed on the display area and extends to the non-display area, and the cathode signal input end is electrically connected to the cathode signal trace through the cathode signal access electrode.

In the OLED display panel described in the embodiment of the present application, the OLED display panel further comprises an anode layer disposed on the substrate, and the anode layer, the wire-passing layer, the source-drain metal layer, and the cathode layer are located in different layers;
  wherein the anode layer comprises a third connection electrode disposed on the non-display area, the reset signal input end and the cathode signal input end are electrically connected to the cathode signal trace through the first connection electrode, the second connection electrode, the third connection electrode, and the cathode signal access electrode, and the cathode signal input end is electrically connected to the cathode signal trace through the third connection electrode and the cathode signal access electrode.

In the OLED display panel described in the embodiment of the present application, the OLED display panel is defined with a first via hole on the non-display area, the first via hole penetrates from the cathode layer to the anode layer, and the cathode signal input end and the third connection electrode are electrically connected through the first via hole.

In the OLED display panel described in the embodiment of the present application, the OLED display panel is defined with a second via hole on the non-display area, the second via hole penetrates from the anode layer to the source-drain metal layer, and the cathode signal access electrode, the third connection electrode, and the second connection electrode are electrically connected through the second via hole.

In the OLED display panel described in the embodiment of the present application, the OLED display panel is defined with a third via hole on the non-display area, the third via hole penetrates from the source-drain metal layer to the wire-passing layer, and the first connection electrode and the second connection electrode are electrically connected through the third via hole.

In the OLED display panel described in the embodiment of the present application, the OLED display panel is defined with a fourth via hole on the display area, the fourth via hole penetrates from the source-drain metal layer to the wire-passing layer, and the reset signal input end, the cathode signal input end, and the first connection electrode are electrically connected through the fourth via hole.

In the OLED display panel described in the embodiment of the present application, the OLED display panel is defined with a fifth via hole on the non-display area, the fifth via hole penetrates from the cathode layer to the source-drain metal layer, and the cathode signal access electrode, the second connection electrode, and the cathode signal input end are electrically connected through the fifth via hole.

In the OLED display panel described in the embodiment of the present application, the pixel driving circuit comprises a first transistor, a second transistor, and a light emitting diode, a source of the first transistor and a source of the second transistor are both electrically connected to the reset signal input end, and a cathode of the light emitting diode is electrically connected to the cathode signal input end.

In a second aspect, the embodiment of the present application provides an organic light emitting diode (OLED) display device, comprising an OLED display panel, wherein the OLED display panel comprises:
  a substrate comprising a display area and a non-display area disposed outside the display area;

a pixel driving circuit disposed on the display area, the pixel driving circuit comprising a reset signal input end and a cathode signal input end; and a cathode signal trace disposed on the non-display area, and the cathode signal trace is electrically connected to both the reset signal input end and the cathode signal input end.

In the OLED display device described in the embodiment of the present application, the OLED display panel comprises a wire-bypass layer, a source-drain metal layer, and a cathode layer disposed on the substrate, wherein the wire-bypass layer, the source-drain metal layer, and the cathode layer are located in different layers;

the wire-bypass layer comprises a first connection electrode, and the first connection electrode is disposed on the display area and extends to the non-display area;

the source-drain metal layer comprises the reset signal input end, a second connection electrode, and a cathode signal access electrode, the reset signal input end is disposed on the display area, the second connection electrode and the cathode signal access electrode are all disposed on the non-display area, and the reset signal input end is electrically connected to the cathode signal trace through the first connection electrode, the second connection electrode, and the cathode signal access electrode; and the cathode layer comprises the cathode signal input end, the cathode signal input end is disposed on the display area and extends to the non-display area, and the cathode signal input end is electrically connected to the cathode signal trace through the cathode signal access electrode.

In the OLED display device described in the embodiment of the present application, the OLED display panel further comprises an anode layer disposed on the substrate, and the anode layer, the wire-passing layer, the source-drain metal layer, and the cathode layer are located in different layers;

wherein the anode layer comprises a third connection electrode disposed on the non-display area, the reset signal input end and the cathode signal input end are electrically connected to the cathode signal trace through the first connection electrode, the second connection electrode, the third connection electrode, and the cathode signal access electrode, and the cathode signal input end is electrically connected to the cathode signal trace through the third connection electrode and the cathode signal access electrode.

In the OLED display device described in the embodiment of the present application, the OLED display panel is defined with a first via hole on the non-display area, the first via hole penetrates from the cathode layer to the anode layer, and the cathode signal input end and the third connection electrode are electrically connected through the first via hole.

In the OLED display device described in the embodiment of the present application, the OLED display panel is defined with a second via hole on the non-display area, the second via hole penetrates from the anode layer to the source-drain metal layer, and the cathode signal access electrode, the third connection electrode, and the second connection electrode are electrically connected through the second via hole.

In the OLED display device described in the embodiment of the present application, the OLED display panel is defined with a third via hole on the non-display area, the third via hole penetrates from the source-drain metal layer to the wire-passing layer, and the first connection electrode and the second connection electrode are electrically connected through the third via hole.

In the OLED display device described in the embodiment of the present application, the OLED display panel is defined with a fourth via hole on the display area, the fourth via hole penetrates from the source-drain metal layer to the wire-passing layer, and the reset signal input end, the cathode signal input end, and the first connection electrode are electrically connected through the fourth via hole.

In the OLED display device described in the embodiment of the present application, the OLED display panel is defined with a fifth via hole on the non-display area, the fifth via hole penetrates from the cathode layer to the source-drain metal layer, and the cathode signal access electrode, the second connection electrode, and the cathode signal input end are electrically connected through the fifth via hole.

In the OLED display device described in the embodiment of the present application, the pixel driving circuit comprises a first transistor, a second transistor, and a light emitting diode, a source of the first transistor and a source of the second transistor are both electrically connected to the reset signal input end, and a cathode of the light emitting diode is electrically connected to the cathode signal input end.

In the OLED display panel and the OLED display device provided in the embodiment of the present application, since a voltage connected to the reset signal trace is similar to a voltage connected to the cathode signal trace, the cathode signal trace can be multiplexed into the reset signal trace; that is, only by setting the cathode signal trace on the non-display area, and outputting a cathode voltage and a reset voltage required by the pixel driving circuit to the reset signal input end and the cathode signal input end through the cathode signal trace, the width of the non-display area can be reduced, so as to achieve a narrow bezel, thereby increasing the screen ratio.

BRIEF DESCRIPTION OF THE SEVERAL VIEWS OF THE DRAWINGS

In order to more clearly explain the technical solutions in the embodiments of the present application, the following will briefly introduce the drawings required in the description of the embodiments. Obviously, the drawings in the following description are only some embodiments of the present application. For those skilled in the art, without paying any creative work, other drawings can be obtained based on these drawings.

DESCRIPTION OF SPECIFIC EMBODIMENTS OF THE INVENTION

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

In the description of this application, it should be understood that the terms "first", "second", "third", "fourth", and "fifth" are for descriptive purposes only and cannot be understood as instructions or Implies relative importance or implicitly indicates the number of technical features indicated. Thus, features defined as "first", "second", "third", "fourth", and "fifth" may explicitly or implicitly include one or more of the features.

In addition, it should be noted that, unless otherwise clearly specified and limited, the terms "installation", "connected", "connected" should be understood in a broad sense, for example, it can be a fixed connection, can also be detachable connection, or integral Connection; it can be a mechanical connection, it can be an electrical connection or can communicate with each other; it can be directly connected, or it can be indirectly connected through an intermediary, it can be the connection between two components or the interaction between two components. For those of ordinary skill in the art, the specific meaning of the above terms in this application can be understood according to specific circumstances.

Figure 1:
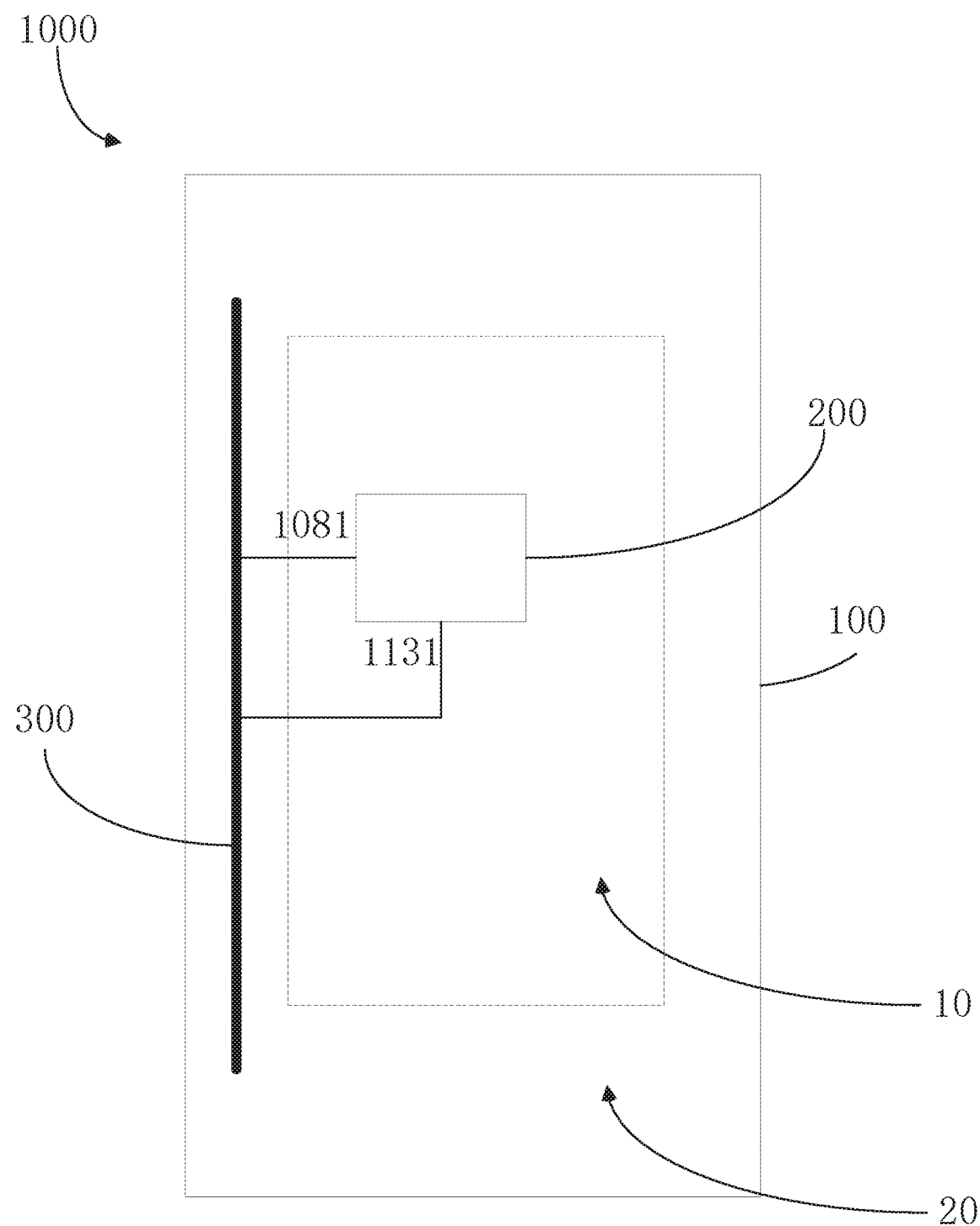
FIG. 1 is a schematic structural diagram of an OLED display panel provided by an embodiment of the present application.

Please refer to FIG. 1, which is a schematic structural diagram of an OLED display panel provided by an embodiment of the present application. As shown in FIG. 1, the OLED display panel 1000 provided by the embodiment of the present application comprises a substrate 100, a pixel driving circuit 200, and a cathode signal trace 300. The substrate 100 comprises a display area 10 and a non-display area 20 disposed outside the display area 10. The pixel driving circuit 200 disposed on the display area 10. The pixel driving circuit 200 comprises a reset signal input end 1081 and a cathode signal input end 1131. The cathode signal trace 300 is disposed on the non-display area 20, and is electrically connected to both the reset signal input end 1081 and the cathode signal input end 1131.

It should be noted that a non-display area of an existing OLED display panel is provided with a cathode signal trace and a reset signal trace. The cathode signal trace is used to provide the cathode voltage required by the pixel driving circuit (generally −2.5 volts to −4.0 volts), the reset signal trace is used to provide the reset voltage required by the pixel drive circuit (generally −3.5 volts). The cathode signal trace is electrically connected to the cathode signal input end of the pixel drive circuit, and the reset signal trace is electrically connected to the reset signal input end of the pixel drive circuit. That is, the existing OLED display panel outputs the cathode voltage to the cathode signal input end of the pixel driving circuit through the cathode signal trace, and outputs the reset voltage to the reset signal input end of the pixel driving circuit through the reset signal trace.

However, in practical applications, since the reset voltage (−3.5 volts) connected to the reset signal trace is close to the cathode voltage (−2.5 volts to −4.0 volts) connected to the cathode signal trace, the OLED display panel 1000 provided in the embodiment of the present application outputs the cathode voltage and the reset voltage required by the pixel driving circuit 200 to the reset signal input end 1081 and the cathode signal input end 1131 through the cathode signal trace 300, so that only the cathode signal trace 300 needs to be provided on the non-display area 20, and no reset signal trace is required, so that the width of the non-display area 20 can be reduced, thereby achieving a narrow bezel.

Figure 2:
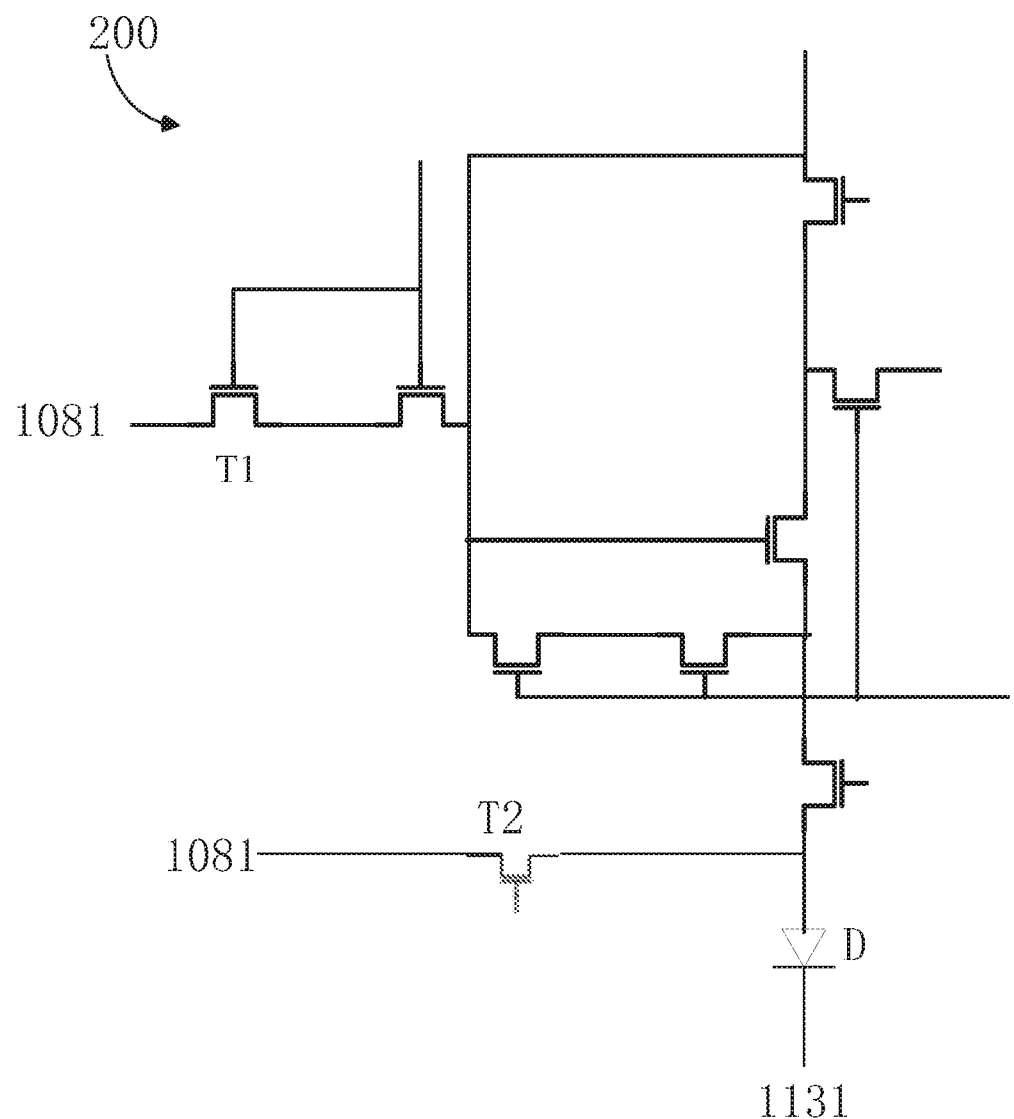
FIG. 2 is a schematic circuit diagram of a pixel driving circuit in the OLED display panel provided by the embodiment of the present application.

In some embodiments, please refer to FIG. 2, which is a schematic circuit diagram of a pixel driving circuit in the OLED display panel provided by the embodiment of the present application. It can be understood that there are various pixel driving circuits in the existing OLED display panel, and the pixel driving circuit 200 shown in FIG. 2 is only one of the pixel driving circuits used in the OLED display panel provided by the present application. However, although there are various pixel driving circuits, each of the pixel driving circuits comprises the cathode signal input end 1131 and a reset signal input end 1081. Each of the pixel driving circuits needs to output the reset voltage to the reset signal input end 1081 through the cathode signal trace 300, and output the cathode voltage to the cathode signal input end 1131 through the cathode signal trace 300.

Combining with FIG. 1 and FIG. 2, the pixel driving circuit 200 comprises a first transistor T1, a second transistor T2, a light-emitting diode D, and other circuit devices. Other circuit devices and the working principles of the pixel driving circuit 200 will not be described in detail here. A source of the first transistor T1 and a source of the second transistor T2 are both connected to the reset voltage. That is, the source of the first transistor T1 and the source of the second transistor T2 are both electrically connected to the reset signal input end 1081. A cathode of the light emitting diode D is connected to the cathode voltage. That is, the cathode of the light emitting diode D is electrically connected to the cathode signal input end 1131.

It should be noted that the transistors used in all the embodiments of the present application may be thin film transistors, field effect transistors, or other devices with the same characteristics. Since the source and drain of the transistor used here are symmetrical, the sources and drains are interchangeable. In the embodiment of the present application, in order to distinguish the two electrodes of the transistor except the gate, one of them is called the source and the other is called the drain. As shown in the figures, the middle end of the switching transistor is the gate, the signal input end is the drain, and the output end is the source. In addition, the transistors used in the embodiment of the present application may comprise P-type transistors and/or N-type transistors, where the P-type transistor is turned on when the gate is at a low level, and is turned off when the gate is at a high level, and the N-type transistor is turned on when the gate is at a high level, and is turned off when the gate is at a low level.

Figure 3:
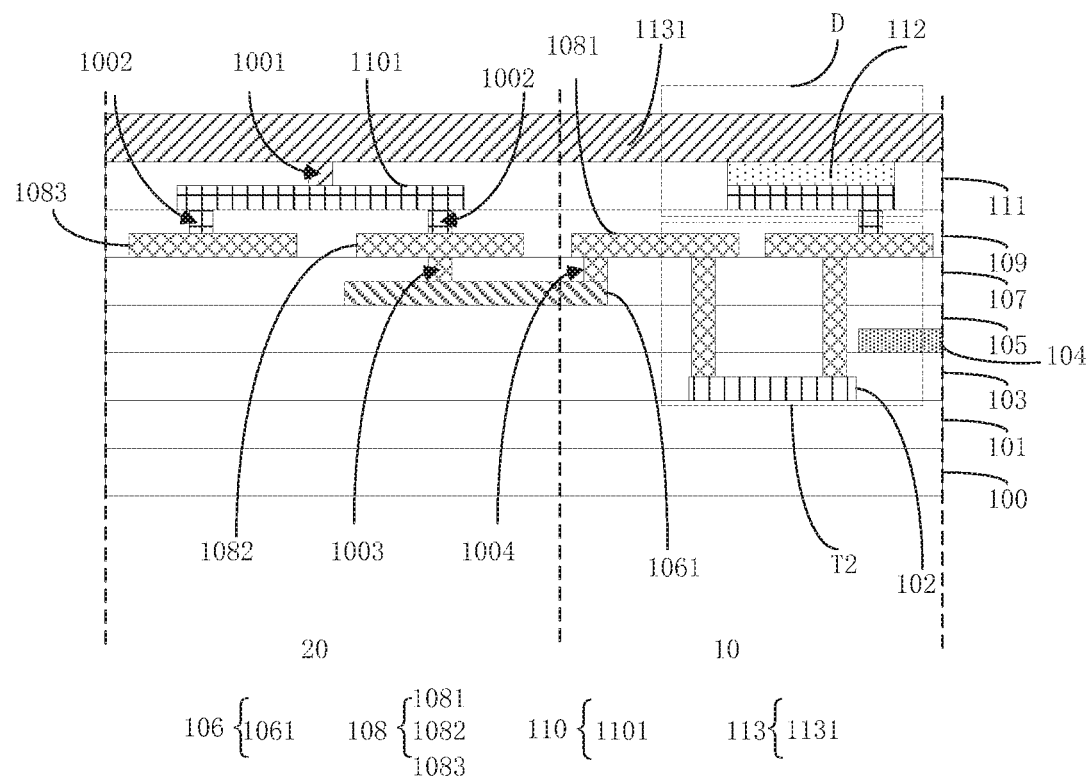
FIG. 3 is a first schematic cross-sectional view of the OLED display panel shown in FIG. 1.
Figure 4:
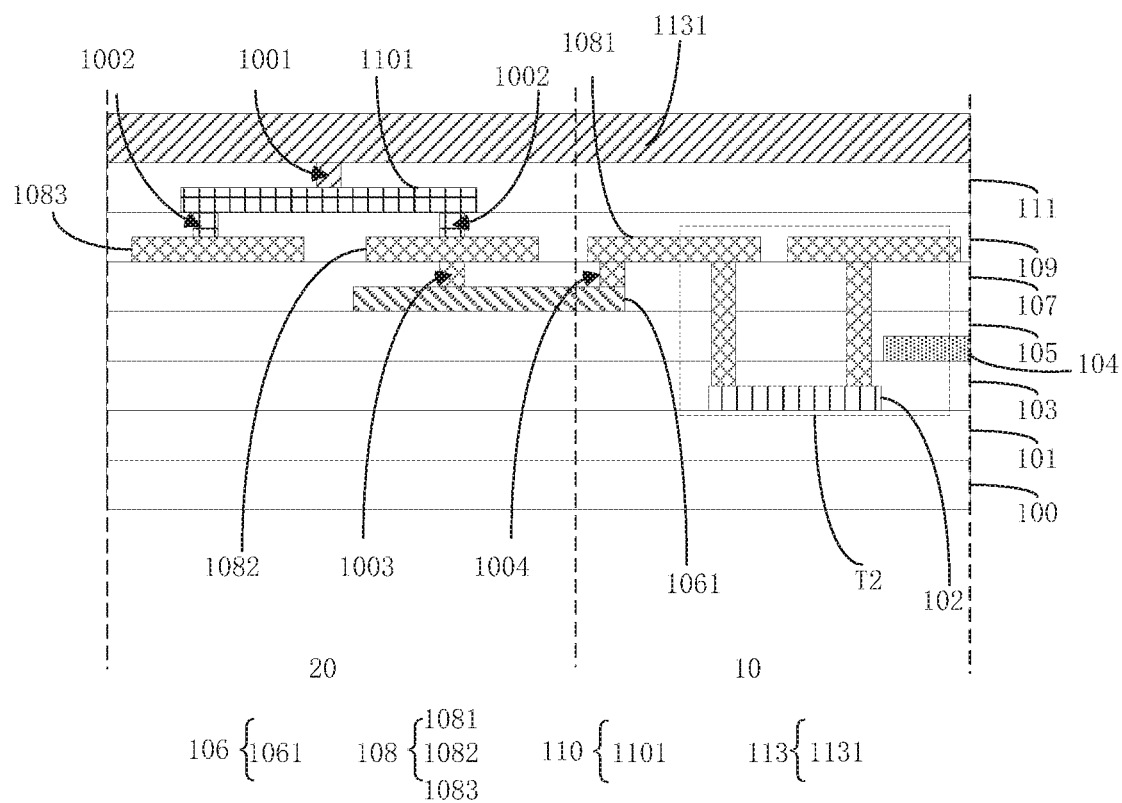
FIG. 4 is a second schematic cross-sectional view of the OLED display panel shown in FIG. 1.

The pixel driving circuit 200 shown in FIG. 2 will be taken as an example to describe the OLED display panel 1000 in detail. In some embodiments, please refer to FIGS. 3 and 4. FIG. 3 is a first schematic cross-sectional view of the OLED display panel shown in FIG. 1, FIG. 4 is a second schematic cross-sectional view of the OLED display panel shown in FIG. 1, and the OLED display panel shown in FIG. 3 and the OLED display panel shown in FIG. 4 are the same display panel. The difference between the OLED display panel shown in FIG. 3 and the OLED display panel shown in FIG. 4 is that the OLED display panel shown in FIG. 3 cuts off the film layer at the first transistor, and the OLED display panel shown in FIG. 4 cuts off the film layer at the second transistor. Among them, FIGS. 3 and 4 only illustrate part of the film layers of the OLED display panel.

Combining with FIGS. 1-4, the OLED display panel comprises a substrate 100, a buffer layer 101, a channel layer 102, a first insulating layer 103, a gate metal layer 104, a second insulating layer 105, a wire-bypass layer 106, a third insulating layer 107, a source-drain metal layer 108, a planarization layer 109, an anode layer 110, a pixel definition layer 111, an organic material layer 112, and a cathode layer 113. The anode layer 110, the wire-bypass layer 106, the source-drain metal layer 108, and the cathode layer 113 are located in different layers. It can be understood that the substrate 100, the buffer layer 101, the channel layer 102, the first insulating layer 103, the gate metal layer 104, the second insulating layer 105, the wire-bypass layer 106, the third insulating layer 107, the source-drain metal layer 108, the planarization layer 109, the anode layer 110, the pixel definition layer 111, the organic material layer 112, and the cathode layer 113 are all film layers in the existing OLED display panel, and will not be described in detail here.

The wire-passing layer 106 comprises a first connection electrode 1061. The first connection electrode 1061 is disposed on the display area 10 and extends to the non-display area 20. The source-drain metal layer 108 comprises the reset signal input end 1081, a second connection electrode 1082, and a cathode signal access electrode 1083. The reset signal input end 1081 is disposed on the display area 10. The second connection electrode 1082 and the cathode signal access electrode 1083 are all disposed on the non-display area 20. The reset signal input end 1081 is electrically connected to the cathode signal trace 300 through the first connection electrode 1061, the second connection electrode 1081, and the cathode signal access electrode 1083. The cathode layer 113 comprises a cathode signal input end 1131. The cathode signal input end 1131 is disposed on the display area 10 and extends to the non-display area 20. The cathode signal input end 1131 is electrically connected to the cathode signal trace 300 through the cathode signal access electrode 1083.

The anode layer 110 comprises a third connection electrode 1101 disposed on the non-display area 20. The reset signal input end 1081 is electrically connected to the cathode signal trace 300 through the first connection electrode 1061, the second connection electrode 1082, the third connection electrode 1101, and the cathode signal access electrode 1083. The cathode signal input end 1131 is electrically connected to the cathode signal trace 300 through the third connection electrode 1101 and the cathode signal access electrode 1083.

That is, in the embodiment of the present application, the reset voltage is sequentially output to the cathode signal access electrode 1083, the third connection electrode 1101, the second connection electrode 1082, and the first connection electrode 1061 through the cathode signal trace 300, and finally output to the reset signal input end 1081 of the pixel driving circuit 200. In the embodiment of the present application, the cathode voltage is sequentially output to the cathode signal access electrode 1083, the third connection electrode 1101 through the cathode signal trace 300, and finally output to the cathode signal input end 1131 of the pixel driving circuit 200.

Specifically, the OLED display panel 1000 is defined with a first via hole 1001, a second via hole 1002, a third via hole 1003, and a fourth via hole 1004. The first via hole 1001 is defined on the non-display area 20. The first via hole 1001 penetrates from the cathode layer 113 to the anode layer 110. The cathode signal input end 1131 and the third connection electrode 1101 are electrically connected through the first via hole 1001. The second via hole 1002 is defined on the non-display area 20. The second via hole 1002 penetrates from the anode layer 110 to the source-drain metal layer 108. The cathode signal access electrode 1083, the third connection electrode 1101, and the second connection electrode 1082 are electrically connected through the second via hole 1002. The third via hole 1003 is defined on the non-display area 20. The third via hole 1003 penetrates from the source-drain metal layer 108 to the wire-passing layer 106. The first connection electrode 1061 and the second connection electrode 1082 are electrically connected through the third via hole 1003. The fourth via hole 1004 is defined on the display area 10, the fourth via hole 1004 penetrates from the source-drain metal layer 108 to the wire-passing layer 106, the reset signal input end 1081 and the first connection electrode 1061 are electrically connected through the fourth via hole 1004.

Figure 5:
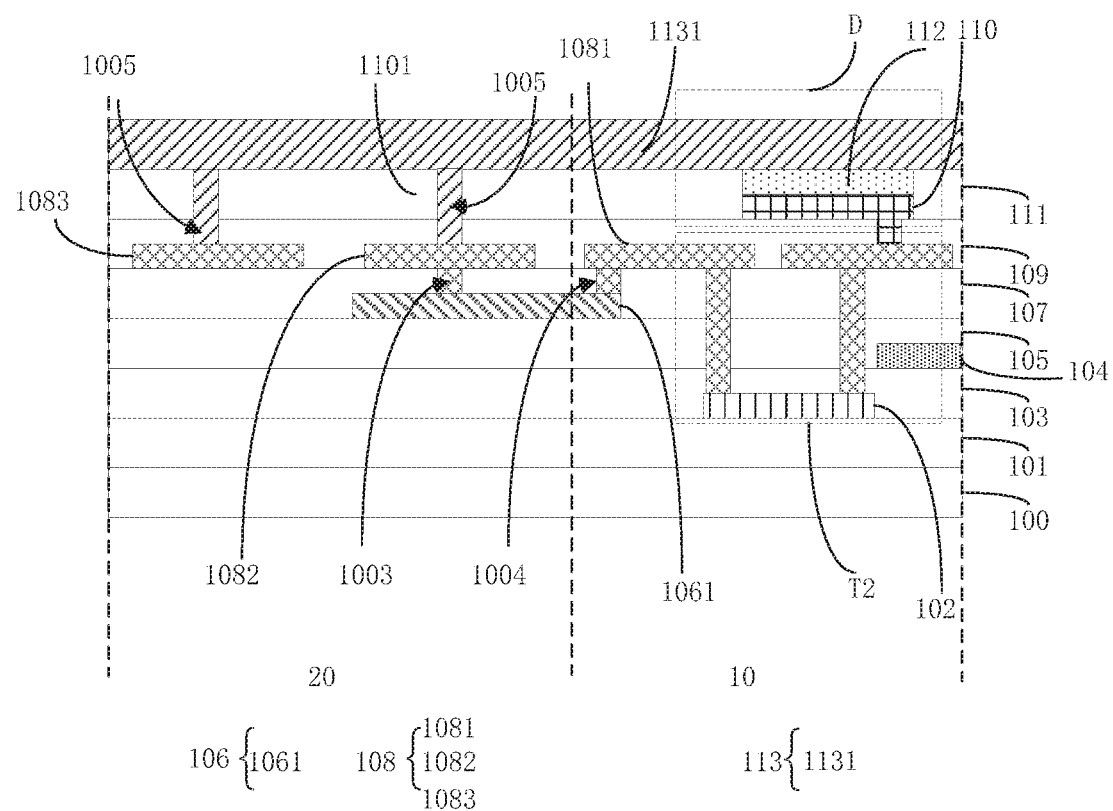
FIG. 5 is a third schematic cross-sectional view of the OLED display panel shown in FIG. 1.
Figure 6:
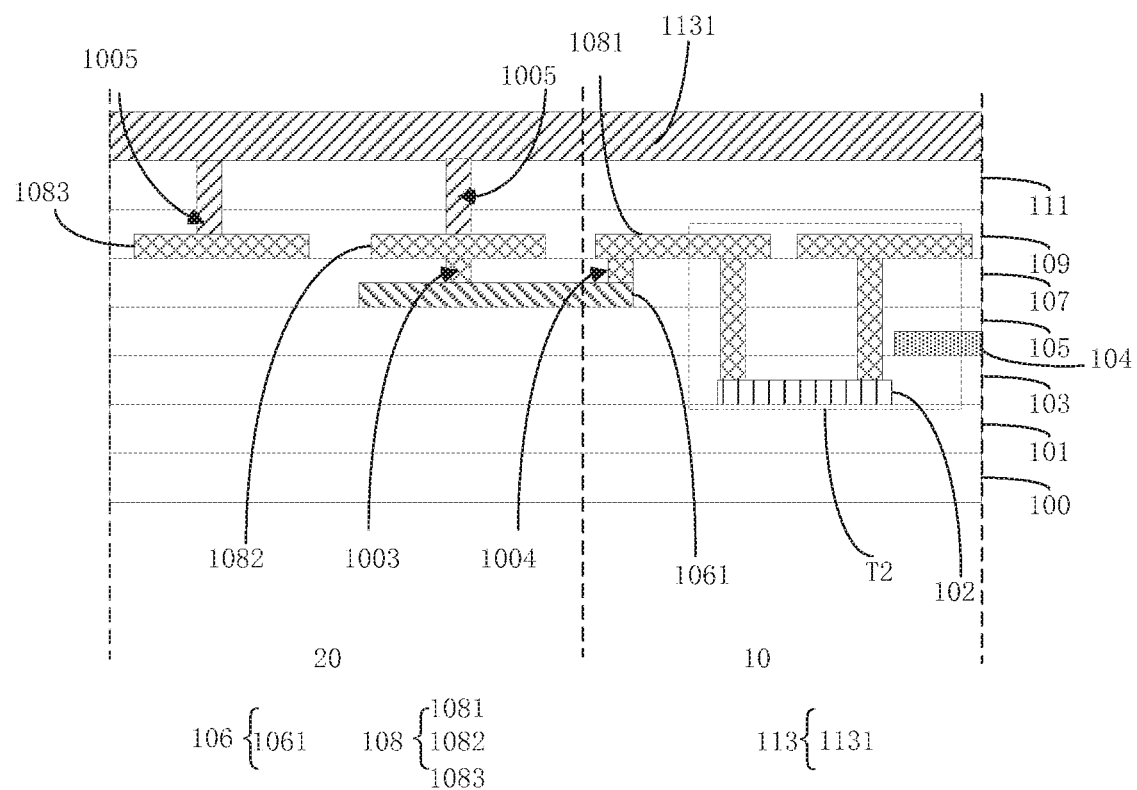
FIG. 6 is a fourth cross-sectional schematic diagram of the OLED display panel shown in FIG. 1.

In some embodiments, please refer to FIGS. 5 and 6. FIG. 5 is a third schematic cross-sectional view of the OLED display panel shown in FIG. 1. FIG. 6 is a fourth schematic cross-sectional view of the OLED display panel shown in FIG. 1. The OLED display panel shown in FIG. 5 and the OLED display panel shown in FIG. 6 are the same display panel. The difference between the OLED display panel shown in FIG. 5 and the OLED display panel shown in FIG. 6 is that the OLED display panel shown in FIG. 5 cuts off the film layer at the first transistor, and the OLED display panel shown in FIG. 6 cuts off the film layer at the second transistor. The difference between the OLED display panel shown in FIGS. 5 and 6 and the OLED display panel shown in FIGS. 3 and 4 is that the OLED display panel shown in FIGS. 5 and 6 are defined with a fifth via hole 1005, which replaces the first via hole 1001 and the second via hole 1002 in the OLED display panel shown in FIGS. 3 and 4. Similarly, FIG. 5 and FIG. 6 only illustrate part of the film layers of the OLED display panel.

Specifically, the fifth via hole 1005 is defined on the non-display area 20, the fifth via hole 1005 penetrates from the cathode layer 113 to the source-drain metal layer 108, the cathode signal access electrode 1083, the second connection electrode 1082 and the cathode signal input end 1131 are electrically connected through the fifth via hole 1005.

That is, the OLED display panel shown in FIGS. 5 and 6 sequentially outputs the reset voltage to the cathode signal access electrode 1083, the second connection electrode 1082, and the first connection electrode 1061 through the cathode signal trace 300, and finally to the rest signal input end 1081 of the pixel driving circuit 200. In the embodiment of the present application, the cathode voltage is also output to the cathode signal access electrode 1083 through the cathode signal trace 300, and finally to the cathode signal input end 1131 of the pixel driving circuit 200.

An embodiment of the present application further provides an OLED display device, which comprises the OLED display panel described in any of the above embodiments, for details, reference may be made to the above description, and details are not described herein.

The embodiments of the present application have been described in detail above, and specific examples have been used in this article to explain the principles and implementation of the present application. Those of ordinary skill in the art, based on the ideas of this application, will have changes in specific implementations and scope of application. In summary, the content of this specification should not be understood as a limitation of this application.

What is claimed is:
1. An organic light emitting diode (OLED) display panel, comprising:
   a substrate having a display area and a non-display area outside the display area;
   a pixel driving circuit disposed on the display area, the pixel driving circuit comprising a reset signal input terminal and a cathode signal input terminal;

a cathode signal trace disposed on the non-display area and electrically connected to both the reset signal input terminal and the cathode signal input terminal; and a wiring layer, a source-drain metal layer, and a cathode layer that are disposed on the substrate and located respectively in different layers, wherein the wiring layer comprises a first connection electrode that is disposed on the display area and extends to the non-display area;

the source-drain metal layer comprises the reset signal input terminal, a second connection electrode, and a cathode signal receiving electrode; the reset signal input terminal is disposed on the display area, and the second connection electrode and the cathode signal receiving electrode are disposed on the non-display area; and the reset signal input terminal is electrically connected to the cathode signal trace through the first connection electrode, the second connection electrode, and the cathode signal receiving electrode; and the cathode layer comprises the cathode signal input terminal, the cathode signal input terminal is disposed on the display area and extends to the non-display area, and the cathode signal input terminal is electrically connected to the cathode signal trace through the cathode signal receiving electrode.

2. The OLED display panel of claim 1, further comprising an anode layer disposed on the substrate, wherein:

the anode layer, the wiring layer, the source-drain metal layer, and the cathode layer are located respectively in different layers; and the anode layer comprises a third connection electrode disposed on the non-display area, the reset signal input terminal is electrically connected to the cathode signal trace through the first connection electrode, the second connection electrode, the third connection electrode, and the cathode signal receiving electrode, and the cathode signal input terminal is electrically connected to the cathode signal trace through the third connection electrode and the cathode signal receiving electrode.

3. The OLED display panel of claim 2, further comprising a first via hole on the non-display area, wherein the first via hole penetrates from the cathode layer to the anode layer, and the cathode signal input terminal and the third connection electrode are electrically connected through the first via hole.

4. The OLED display panel of claim 2, further comprising a second via hole on the non-display area, wherein the second via hole penetrates from the anode layer to the source-drain metal layer, and the cathode signal receiving electrode, the third connection electrode, and the second connection electrode are electrically connected through the second via hole.

5. The OLED display panel of claim 2, further comprising a third via hole on the non-display area, wherein the third via hole penetrates from the source-drain metal layer to the wiring layer, and the first connection electrode and the second connection electrode are electrically connected through the third via hole.

6. The OLED display panel of claim 2, further comprising a fourth via hole on the display area, wherein the fourth via hole penetrates from the source-drain metal layer to the wiring layer, and the reset signal input terminal and the first connection electrode are electrically connected through the fourth via hole.

7. The OLED display panel of claim 1, further comprising a fifth via hole on the non-display area, wherein the fifth via hole penetrates from the cathode layer to the source-drain metal layer, and the cathode signal receiving electrode, the second connection electrode, and the cathode signal input terminal are electrically connected through the fifth via hole.

8. The OLED display panel of claim 1, wherein the pixel driving circuit comprises a first transistor, a second transistor, and a light emitting diode, a source of the first transistor and a source of the second transistor are both electrically connected to the reset signal input terminal, and a cathode of the light emitting diode is electrically connected to the cathode signal input terminal.

9. An organic light emitting diode (OLED) display device, comprising an OLED display panel, wherein the OLED display panel comprises:

a substrate having a display area and a non-display area outside the display area;

a pixel driving circuit disposed on the display area, the pixel driving circuit comprising a reset signal input terminal and a cathode signal input terminal;

a cathode signal trace disposed on the non-display area and electrically connected to both the reset signal input terminal and the cathode signal input terminal; and a wiring layer, a source-drain metal layer, and a cathode layer that are disposed on the substrate and located respectively in different layers, wherein the wiring layer comprises a first connection electrode that is disposed on the display area and extends to the non-display area;

the source-drain metal layer comprises the reset signal input terminal, a second connection electrode, and a cathode signal receiving electrode; the reset signal input terminal is disposed on the display area, and the second connection electrode and the cathode signal receiving electrode are disposed on the non-display area; and the reset signal input terminal is electrically connected to the cathode signal trace through the first connection electrode, the second connection electrode, and the cathode signal receiving electrode; and the cathode layer comprises the cathode signal input terminal, the cathode signal input terminal is disposed on the display area and extends to the non-display area, and the cathode signal input terminal is electrically connected to the cathode signal trace through the cathode signal receiving electrode.

10. The OLED display device of claim 9, wherein the OLED display panel further comprises an anode layer disposed on the substrate;

the anode layer, the wiring layer, the source-drain metal layer, and the cathode layer are located respectively in different layers; and the anode layer comprises a third connection electrode disposed on the non-display area, the reset signal input terminal is electrically connected to the cathode signal trace through the first connection electrode, the second connection electrode, the third connection electrode, and the cathode signal receiving electrode, and the cathode signal input terminal is electrically connected to the cathode signal trace through the third connection electrode and the cathode signal receiving electrode.

11. The OLED display device of claim 10, wherein the OLED display panel further comprises a first via hole on the non-display area, the first via hole penetrates from the cathode layer to the anode layer, and the cathode signal input terminal and the third connection electrode are electrically connected through the first via hole.

12. The OLED display device of claim 10, wherein the OLED display panel further comprises a second via hole on the non-display area, the second via hole penetrates from the anode layer to the source-drain metal layer, and the cathode signal receiving electrode, the third connection electrode, and the second connection electrode are electrically connected through the second via hole.

13. The OLED display device of claim 10, wherein the OLED display panel further comprises a third via hole on the non-display area, the third via hole penetrates from the source-drain metal layer to the wiring layer, and the first connection electrode and the second connection electrode are electrically connected through the third via hole.

14. The OLED display device of claim 10, wherein the OLED display panel further comprises a fourth via hole on the display area, the fourth via hole penetrates from the source-drain metal layer to the wiring layer, and the reset signal input terminal and the first connection electrode are electrically connected through the fourth via hole.

15. The OLED display device of claim 9, wherein the OLED display panel further comprises a fifth via hole on the non-display area, the fifth via hole penetrates from the cathode layer to the source-drain metal layer, and the cathode signal receiving electrode, the second connection electrode, and the cathode signal input terminal are electrically connected through the fifth via hole.

16. The OLED display device of claim 9, wherein the pixel driving circuit comprises a first transistor, a second transistor, and a light emitting diode, a source of the first transistor and a source of the second transistor are both electrically connected to the reset signal input terminal, and a cathode of the light emitting diode is electrically connected to the cathode signal input terminal.

\* \* \* \* \*